US005577820A

United States Patent [19]
Kim et al.

[11] Patent Number: 5,577,820
[45] Date of Patent: Nov. 26, 1996

[54] FOLD IN ACCESS DOOR

[75] Inventors: Brian J. Kim; Satoshi Miyajima, both of San Diego, Calif.

[73] Assignees: Sony Corporation, Tokyo, Japan; Sony Electronics Inc., Park Ridge, N.J.

[21] Appl. No.: 369,618

[22] Filed: Jan. 6, 1995

[51] Int. Cl.⁶ .................................................. A47B 81/06
[52] U.S. Cl. ...................... 312/319.2; 312/7.2; 312/329; 292/DIG. 4
[58] Field of Search ............................. 312/7.2, 7.1, 204, 312/319.1, 319.2, 329, 326, 223.1, 138.1, 327, 328; 292/DIG. 4, 210; 220/4.02, 334

[56] References Cited

U.S. PATENT DOCUMENTS

| | | | |
|---|---|---|---|
| D. 171,962 | 4/1954 | Abrams et al. | 312/7.2 X |
| 1,544,694 | 7/1925 | Speidel | 312/329 X |
| 2,442,515 | 6/1948 | Shreve | 312/138.1 |
| 3,134,510 | 5/1964 | Cretors | 312/327 X |
| 3,137,042 | 6/1964 | Levenberg | 220/334 X |
| 3,628,288 | 12/1971 | Berenbaum | 312/7.2 X |
| 3,650,584 | 3/1972 | Goetz, Jr. et al. | 312/7.2 |
| 3,744,864 | 7/1973 | Schmitz | 312/7.2 X |
| 3,749,274 | 7/1973 | Mele et al. | 220/334 |
| 4,630,794 | 12/1986 | Ross | 312/319.2 X |
| 4,792,165 | 12/1988 | Nishimura | 292/DIG. 4 |

*Primary Examiner*—Peter M. Cuomo
*Assistant Examiner*—Janet M. Wilkens
*Attorney, Agent, or Firm*—Pasquale Musacchio; Jerry A. Miller

[57] ABSTRACT

A door for an electronic device, wherein enclosure includes an internal cavity and an aperture for providing access to the internal cavity. The door includes a planar element for opening and closing an aperture of the enclosure. The door is rotatably attached to the enclosure to enable outward rotation of the planar element away from the internal cavity to a first position wherein the aperture is closed by the planar element and to enable inward rotation of the planar element toward the internal cavity to a second position wherein the aperture is opened. The planar element further includes an edge which contacts an edge of the aperture to stop the outward rotation when the planar element is at the first position. In addition, the door includes a V-shaped spring element for biasing the planar element to urge the planar element to provide the outward rotation. Furthermore, the door includes a push catcher for releasably holding the planar element in the second position.

8 Claims, 4 Drawing Sheets

5,577,820

FOLD IN ACCESS DOOR

FIELD OF THE INVENTION

This invention relates to enclosures for electronic apparatus, and more particularly, to an access door for an enclosure which opens, or folds, inward toward an interior of the enclosure.

BACKGROUND OF THE INVENTION

Many electronic and other apparatus typically include control knobs, buttons, audio/visual input and output jacks and other devices which are used to control selected operating parameters of the electronic apparatus or to interface with other electronic apparatus. Frequently, such devices are mounted on an outside surface of the electronic apparatus to enable a user to access a selected device as desired. As such, the devices are subject to being contaminated with dust and other foreign particles which may affect their operation. Further, the devices are visible to the user when the electronic apparatus is viewed. This undesirably detracts from the aesthetic appeal of the electronic apparatus.

In order to protect the devices from contamination and improve aesthetic appeal, access doors have been utilized which may be placed in a closed position to conceal and protect the devices and in an open position to provide access to a selected device as desired. Typically, such access doors are configured such that they open, or fold, outward such that a section of the access door extends outward from the electronic apparatus to form a projecting door section. However, such access doors have disadvantages. A disadvantage is that additional space is needed to accommodate movement of the projecting door section between the open and closed positions when the electronic apparatus is mounted in a cabinet or is displayed. A further disadvantage is that the access door is subject to being damaged due to collisions between the projecting door section and moving objects or people when the access door is in the open position. Moreover, the likelihood of damage is increased when the electronic apparatus is displayed in an area where a large number of people are present, such as in a retail store or other high traffic area. Furthermore, such access doors typically include a handle, grip or other structure to facilitate opening and closing of the access door. However, such structures are visible when the electronic apparatus is viewed and undesirably detract from the aesthetic appeal of the door and of the electronic apparatus in general. In addition, since the projecting door section extends outward from the electronic apparatus, the projecting door section is substantially noticeable, thus further detracting from the aesthetic appeal of the electronic apparatus.

Therefore, it is an object of the present invention to provide a configuration for an access door wherein the likelihood of damage to the access door is substantially reduced or eliminated. It is a further object of the present invention to provide an access door which does not substantially increase the amount of space needed for the electronic apparatus. It is a still further object of the present invention to provide an access door which is aesthetically appealing. Furthermore, it is an object of the present invention to provide an access door which is inexpensive to fabricate and relatively easy to assemble.

SUMMARY OF THE INVENTION

A door for an enclosure for an electronic device, wherein the enclosure includes an aperture for providing access to an internal cavity located within the enclosure. The door includes a planar element rotatably attached to the enclosure to enable outward rotation of the planar element away from the internal cavity to a first position wherein the aperture is closed by the planar element and to enable inward rotation of the planar element toward the internal cavity to a second position wherein the aperture is opened. The planar element further includes an edge which contacts an edge of the aperture to stop the outward rotation when the planar element is at the first position. In addition, the door includes a spring element for biasing the planar element to urge the planar element to provide the outward rotation. Furthermore, the door includes a push catcher for releasably holding the planar element in the second position.

DETAILED DESCRIPTION OF THE INVENTION

Figure 1:
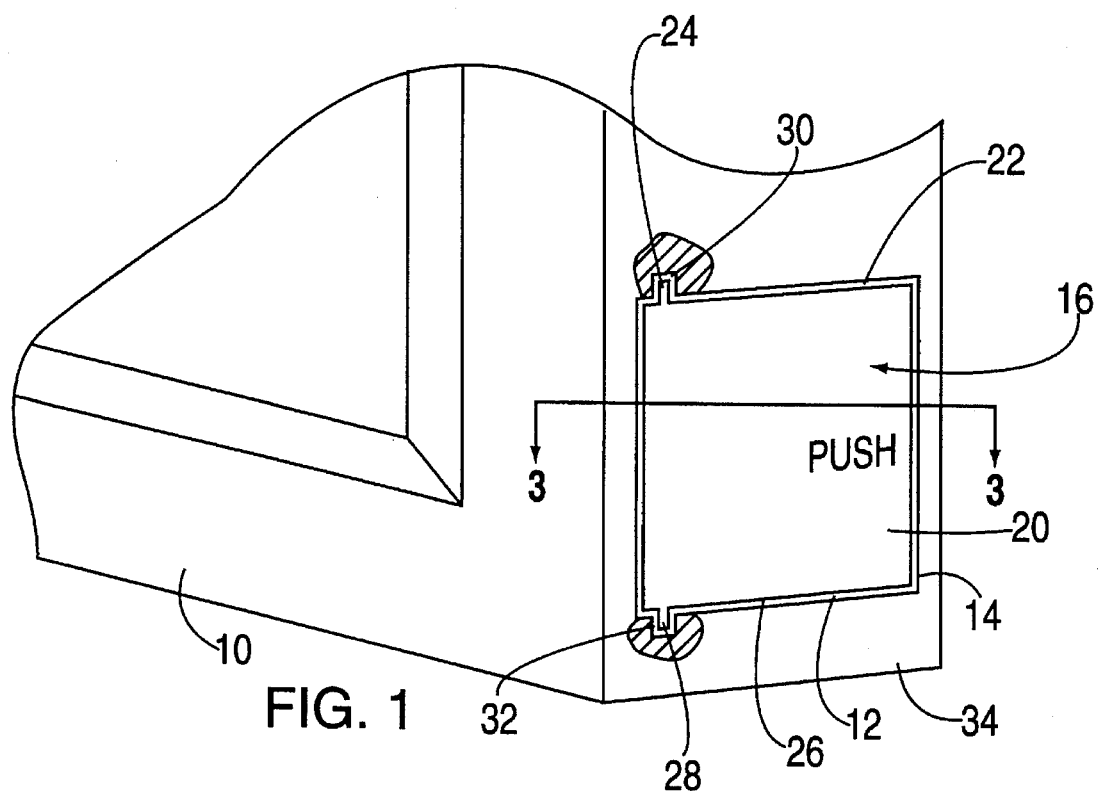
FIG. 1 shows a fold in access door in accordance with the present invention in a closed position.

Reference is now made to FIGS. 1–6B, wherein like elements are designated by like reference numerals. Referring to FIG. 1, a portion of an enclosure such as a cabinet 10 for a television is shown. It is noted that the present invention may also be utilized in conjunction with other enclosures wherein it is desirable to conceal, protect and provide access to control knobs, buttons, switches, audio\visual (A\V) input and output jacks and other devices. This includes enclosures used for audio components, computer monitors, video cassette recorders, camcorders and other electronic equipment. Moreover, it is further noted that the present invention may also be utilized in conjunction with other apparatus such as a fuel filler cap for a motor vehicle.

The cabinet 10 includes an opening 12 having a first edge 14 formed around the opening 12. A fold in access door 16 in accordance with the present invention is shown positioned within the opening 12. The access door 16 includes a door outer surface 20 and a top surface 22. The top surface 22 includes an upper projection 24 which extends upwardly from the top surface 22. The access door 16 further includes a bottom surface 26 and a lower projection 28 which extends downwardly from the bottom surface 26. The cabinet 10 further includes top 30 and bottom 32 apertures (each shown as partial cross section views) which are sized to receive the upper 24 and lower 28 projections, respectively. The upper 24 and lower 28 projections are adapted to rotate within the top 30 and bottom 32 apertures, respectively. This enables the access door 16 to rotate within the opening 12 between a closed position for concealing and protecting, for example, A\V jacks, and an open position for providing access to the A\V jacks. Referring to FIG. 1, the access door 16 is shown in the closed position.

The cabinet 10 further includes a cabinet outer surface 34 having a predetermined contour. Further, the door outer surface 20 has a contour which is shaped to correspond to the contour of the cabinet outer surface 34. When the access door 16 is in the closed position, the contour of the door outer surface 20 is aligned with the cabinet outer surface 34. This substantially masks visibility of the access door 16 to provide an integrated appearance which enhances aesthetic appeal of the cabinet 10.

Figure 2:
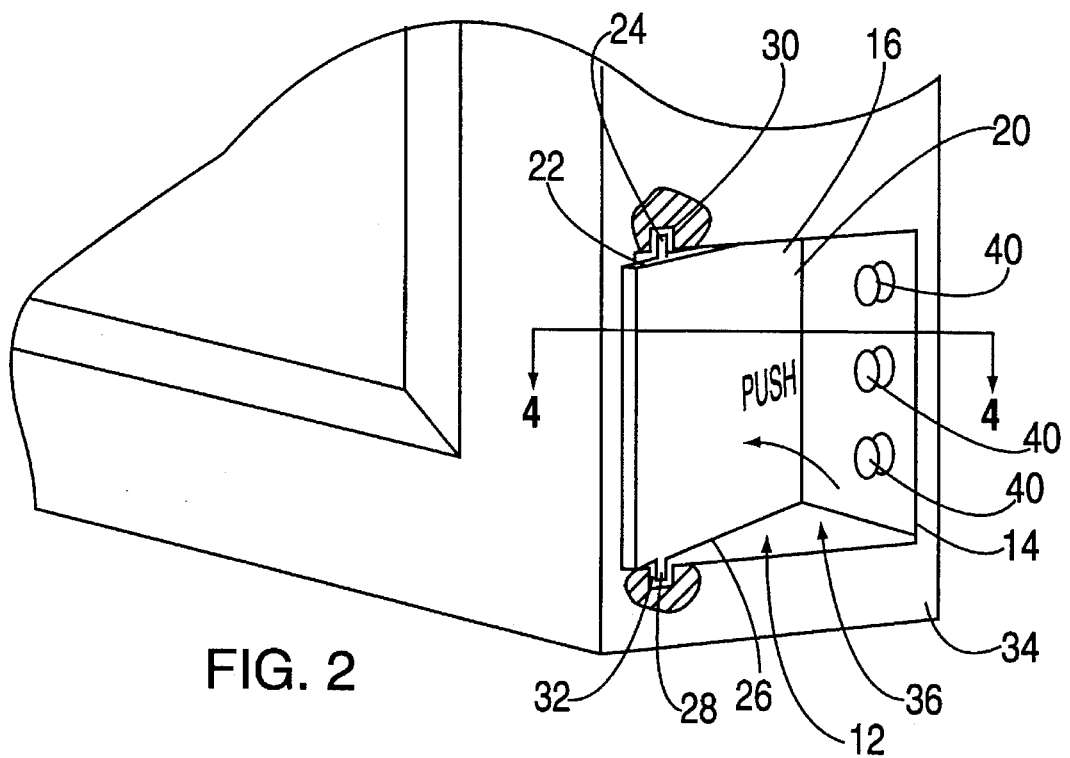
FIG. 2 shows the fold in access door in an open position.

Referring to FIG. 2, the access door 16 is shown in the open position. The cabinet 10 includes an interior compartment 36 having a side surface 38 which includes, for example, A\V jacks 40 although it is noted that other devices may be included. The access door 16 is opened by applying a first external force, such as finger pressure, on the door outer surface 20 which is sufficient to cause rotation of the access door 16 inward toward the interior compartment 36 as indicated by the arrow, thus enabling access to the A\V jacks 40. By way of example, the first external force may be approximately 0.1 kg.

Figure 3:
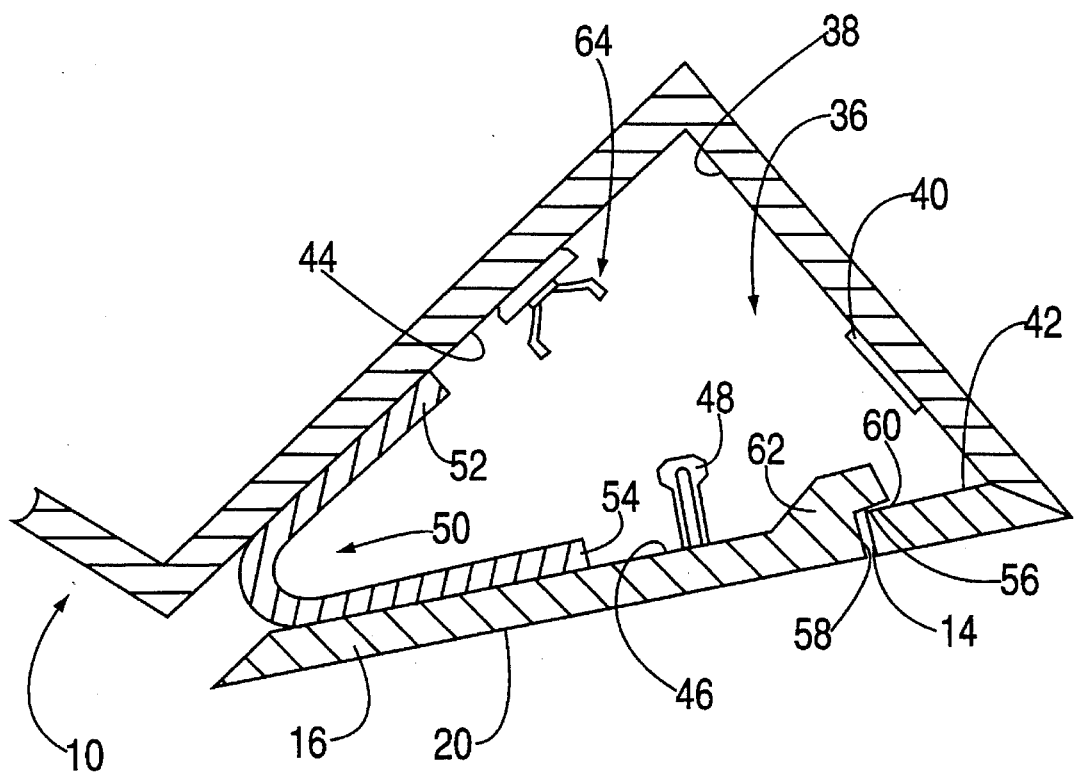
FIG. 3 is a cross sectional view of a cabinet, interior compartment and the access door along section line 3—3 of FIG. 1.

Referring to FIG. 3, a cross sectional view of the cabinet 10, interior compartment 36 and access door 16 in the closed position along section line 3—3 of FIG. 1 is shown. The interior compartment 36 includes a cabinet inner surface 42 and a back surface 44. The side surface 38 is located between the cabinet inner surface 42 and the back surface 44. Further, the access door 16 includes a door inner surface 46 having an upstanding post 48 extending toward the back surface 44. A spring 50 having first 52 and second 54 spring elements positioned approximately 45° relative to each other to form a V-shape is positioned between the back surface 44 and the door inner surface 46. The first 52 and second 54 spring elements are positioned against the back surface 44 and the door inner surface 46, respectively, so as to bias the spring 50 and urge the access door 16 to rotate outward away from the back surface 44 to the closed position. The spring 50 is preferably of sufficient durability to withstand approximately 30,000 openings and closings of the access door 16. In addition, the spring 50 may be fabricated from spring carbon steel having a thickness of approximately 0.25 mm.

The cabinet inner surface 42 terminates at the first edge 14 to form a corner edge 56 within the interior compartment 36. The access door 16 further includes a door edge 62 having a vertical portion 58 and a contact portion 60 angled upwardly and to the right of the vertical portion 58. The contact portion 60 is adapted to contact the corner edge 56 to stop outward rotation of the access door 16 and position the access door 16 in the closed position. By way of example, the contact portion 60 may be approximately 0.4 mm.

In addition, the back surface 44 includes a latching mechanism known commercially as a push catcher 64. In this regard, it is noted that several types of commercially available push catchers may be utilized in the present invention. The push catcher 64 serves to releasably secure and hold the post 48 and thus the access door 16 in the open position.

Figure 4:
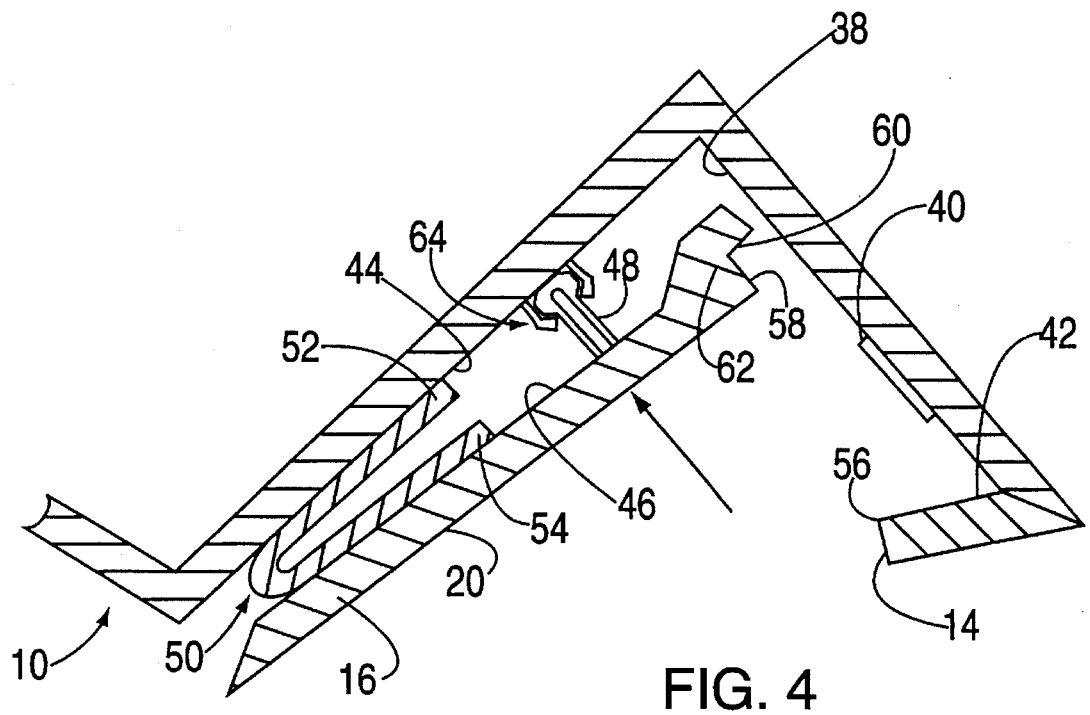
FIG. 4 is a cross sectional view of the cabinet, interior compartment and the access door along section line 4—4 of FIG. 2.

Referring to FIG. 4, a cross sectional view of the cabinet 10, interior compartment 36 and access door 16 in the open position along section line 4—4 of FIG. 2 is shown. The access door 16 is placed in the open position by applying the first external force (indicated by arrow) on the door outer surface 20 sufficient to overcome the spring bias of the spring 50 and rotate the access door 16 toward the back surface 44. This causes the post 48 to move inward toward the push catcher 64. Upon rotation of the access door 16 to the open position, the post 48 is releasably secured by the push catcher 64, thus holding the access door 16 in the open position. This provides access to the A/V jacks 40 as desired. In the open position, the spring 50 is biased to urge the access door 16 to rotate outward away from the back surface 44 to the closed position.

In order to release the post 48 from the push catcher 64, a second external force is applied to the door outer surface 20 sufficient to overcome the spring bias of the spring 50 and rotate the access door 16 inward toward the back surface 44 past the open position. This causes the post 48 to move further inward into the push catcher 64 to cause the push catcher 64 to release the post 48, thus enabling the access door 16 to rotate outward away from the back surface 44. The access door 16 then rotates outward until the contact portion 60 contacts the corner edge 56, thus stopping outward rotation of the access door 16 and positioning the access door 16 in the closed position (FIG. 3). By way of example, the second external force may be approximately 0.25 kg.

Figure 5A:
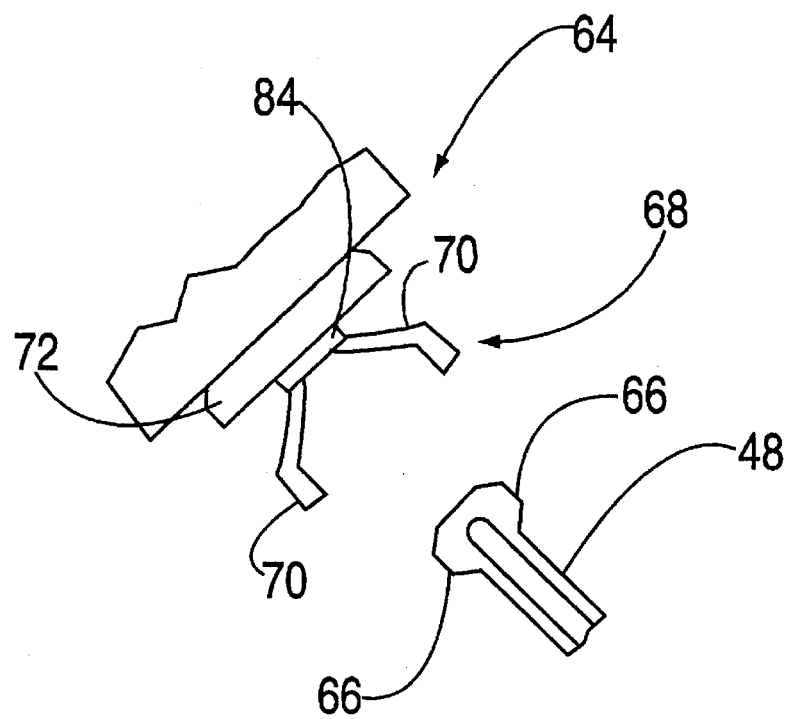
FIGS. 5A and 5B depict a push catcher and post in unlatched and latched positions, respectively.
Figure 5B:
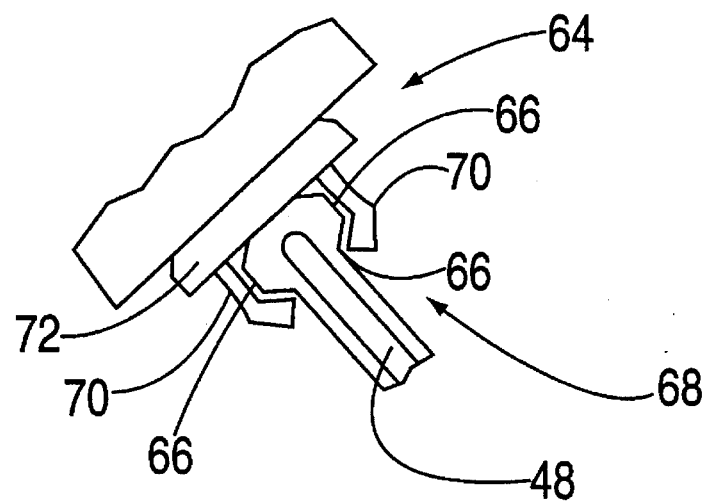

Referring to FIGS. 5A and 5B, a side view of the push catcher 64 and post 48 is shown. The post 48 includes shoulder elements 66 which extend horizontally outward from the post 48. The push catcher 64 includes a latching element 68 having a base section 84 positioned between opposed fingers 70 adapted for engaging the shoulder elements 66. The fingers 70 and base section 84 extend outwards from a sleeve 72. Referring to FIG. 5A, the latching element 68 is shown in an unlatched position wherein the fingers 70 are spaced apart from each other. When the access door 16 is in the closed position, the post 48 is spaced apart from the fingers 70 and the latching element 68 is in the unlatched position as shown in FIG. 5A.

The fingers 70 and base section 84 are fabricated from a resilient material and are adapted to engage the shoulder elements 66. Further, the push catcher 64 is constructed such that the latching element 68 may be retracted into the sleeve 72. Upon application of the first external force, the access door 16 is rotated inward toward the back surface 44, thus causing the post 48 to move toward the push catcher 64. When the access door 16 is rotated to the open position, the post 48 contacts the base 84 and to push the latching element 68 into the sleeve 72 to a first retracted position within the sleeve 72. This causes contact between the sleeve 72 and the fingers 70, thus causing the fingers 70 to move toward each other in a latched position to engage and hold the shoulder elements 66. Referring to FIG. 5B, the latching element 68 is shown in the latched position. Further, the push catcher 64 includes a holding mechanism (not shown) for releasably securing the latching element 68 in the first retracted position.

In the latched position, the fingers 70 become biased due to their resiliency to move back to the unlatched position. Additionally, in the latched position, the latching element 68 is urged to move out of the sleeve 72 by a biasing mechanism (not shown). The holding mechanism is adapted to release the latching element 68 upon further retraction of the latching element 68 within the sleeve 72 to a second retracted position. Therefore, upon application of the second external force, the access door 16 is rotated inward toward the back surface 44 past the open position. This causes the post 48 to move further inward into the push catcher 64 to further retract the latching element 68 within the sleeve 72 to the second retracted position. The holding mechanism then releases the latching element 68, thus enabling the biasing mechanism to urge and move the latching element 68 out of the sleeve 72 to enable the fingers 70 to move to the unlatched position to release the post 48. As a result, the access door 16 is able to rotate away from the back surface 44 to the closed position.

Figure 6A:
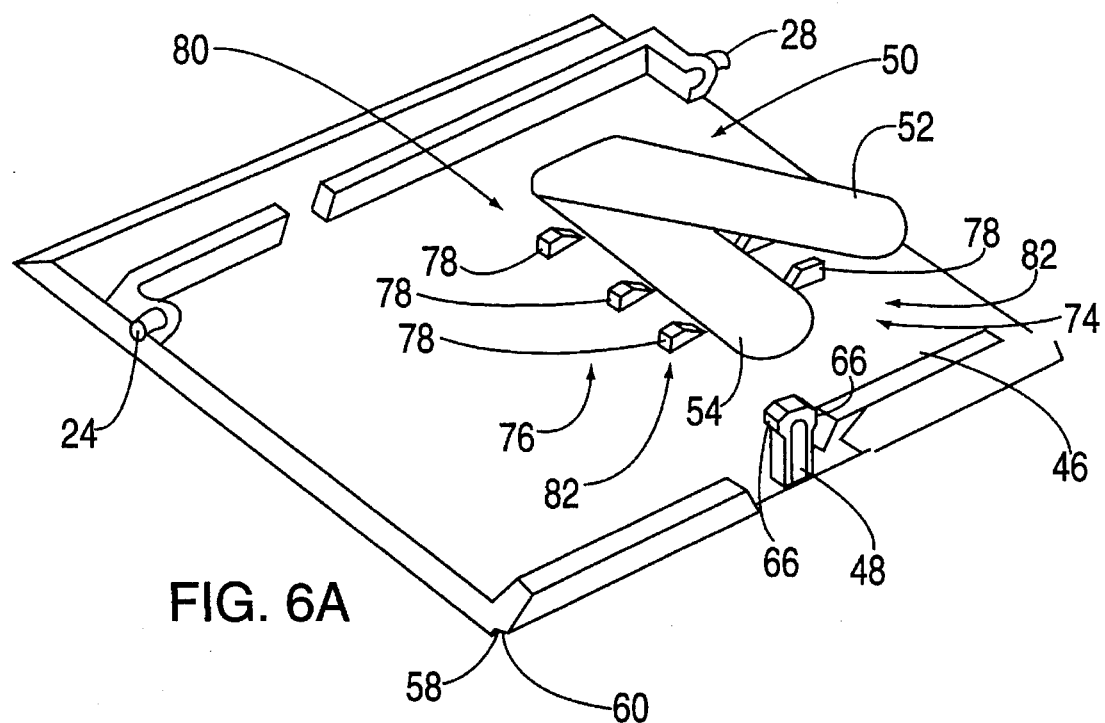
FIGS. 6A and 6B shows door ribs for inhibiting movement of a spring on a door inner surface.
Figure 6B:
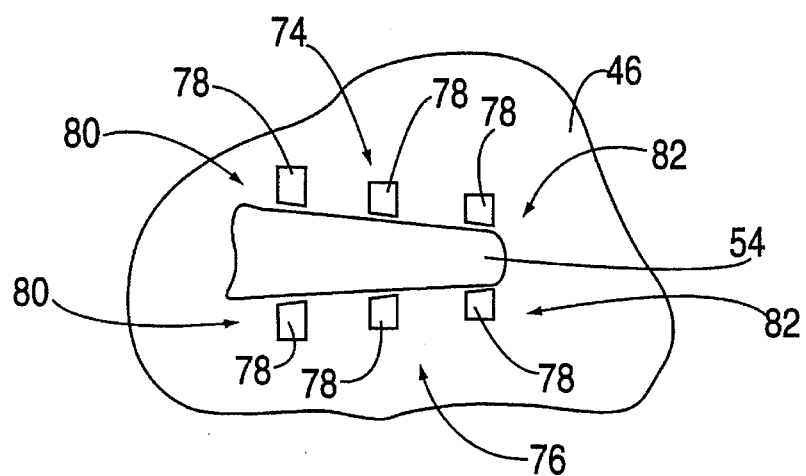

Referring to FIGS. 6A and 6B, a view of the door inner surface 46 is shown. The door inner surface 46 further includes upper 74 and lower 76 rows of door ribs 78 each having first 80 and second 82 ends. The second spring element 54 has a tapered shape and is positioned between the upper 74 and lower 76 rows. The upper 74 and lower 76 rows are each oriented at approximately 1° from a horizontal direction such that a distance between each first end 80 of the upper 74 and lower rows 76 is greater than a distance between each second end 82 of the upper 74 and lower 76 rows to form a tapered arrangement which corresponds to the tapered shape of the second spring element 54. The tapered arrangement inhibits movement of the second spring element 54 in a direction toward the second ends 82 of the upper 74 and lower 76 rows.

Assembly of the access door 16 to the cabinet 10 will now be described. The access door 16 is preferably fabricated from a material having resilient characteristics such as plastic. First, a projection, such as lower projection 28, is inserted into bottom aperture 32. Then, the resilient characteristics of the access door 16 enable an operator to slightly deform the access door 16 so as to enable insertion of the upper projection 24 into the top aperture 30. Once this is accomplished, the resilient characteristics of the access door 16 cause the access door 16 to return back to its original shape. Next, the access door 16 is again slightly deformed by the operator in order to enable the door edge 62 to move past first edge 14 and into the interior compartment 36. Once this is accomplished, the resilient characteristics of the access door 16 again cause the access door 16 to return back to its original shape, thus completing assembly of the access door 16 to the cabinet 10.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A fold in door structure, comprising:

an enclosure for an electronic device, said enclosure having an aperture providing access to an internal cavity within said enclosure;

a planar element rotatably attached adjacent an edge of said aperture allowing outward rotation of said planar element away from said internal cavity to a first position wherein said aperture is closed by said planar element and inward rotation of said planar element to a second position wherein said planar element is oriented in a sloped position relative to said enclosure and wherein a first portion including more than half of said planer element is positioned within said internal cavity to open said aperture and wherein a second portion of said planar element, which is smaller than said first portion, projects from said enclosure to form a single projecting door section which is in said sloped position relative to said enclosure;

rotation stopping means for stopping said outward rotation at said first position; and a spring element for biasing said planar element to urge said planar element to provide said outward rotation.

2. A door according to claim 1, wherein said spring element is V-shaped.

3. A door according to claim 1, wherein said enclosure includes top and bottom recesses and said planar element includes top and bottom projections which extend into said top and bottom recesses, respectively, said top and bottom projections being adapted to rotate within said top and bottom recesses for enabling said outer and inward rotations of said planar element.

4. A door according to claim 1, further including a holding element for holding said planar element in said second position.

5. A door according to claim 1, wherein said internal cavity includes control devices for controlling operation of said electronic device.

6. A fold in door structure, comprising:

an enclosure for an electronic device, said enclosure having an aperture providing access to an internal cavity within said enclosure, said aperture defining a first vertical edge located between top and bottom horizontal edges having top and bottom recesses, respectively, located adjacent said vertical edge;

a planar element having top and bottom projections positioned adjacent an edge of said planar element, wherein said top and bottom projections extend into said top and bottom recesses, respectively, for rotation of said planar element away from said internal cavity to a first position wherein said aperture is closed by said planar element and for inward rotation of said planar element to a second position wherein a first portion including more than half of said planar element is positioned within said internal cavity to open said aperture and wherein a second portion of said planar element, which is smaller than said first portion, projects from said enclosure to form a single projecting door section;

rotation stopping means for stopping said outward rotation at said first position;

a V-shaped spring element for biasing said planar element to urge said planar element to provide said outward rotation, wherein said spring element includes first and second members, said enclosure includes a back surface and said planar element includes an inner surface positioned opposite said back surface, wherein said first member abuts against said back surface and said second member abuts against said inner surface and wherein said inner surface includes first and second rows of ribs and said second member is secured between said ribs; and holding means for releasably holding said planar element in said second position.

7. A door according to claim 6, wherein said internal cavity includes control devices for controlling operation of said electronic device.

8. The door structure according to claim 6, wherein said second member and said first and second rows are tapered.

* * * * *